United States Patent [19]

Giebel

[11] Patent Number: 5,608,346
[45] Date of Patent: Mar. 4, 1997

[54] MOS DRIVER CIRCUIT FOR SUPPRESSING INTERFERENCE BY PREVENTING SHUNT CURRENTS

[75] Inventor: Burkhard Giebel, Denzlingen, Germany

[73] Assignee: Deutsche ITT Industries GmbH, Freiberg, Germany

[21] Appl. No.: 491,500

[22] Filed: Jun. 16, 1995

[30] Foreign Application Priority Data

Jun. 18, 1994 [DE] Germany ........................... 44 21 419.7

[51] Int. Cl.⁶ ..................................................... H03K 17/16
[52] U.S. Cl. .......................... 327/382; 327/108; 327/391; 327/389; 326/27
[58] Field of Search .................................. 327/108, 110, 327/111, 112, 130, 391, 389, 387, 383, 384, 382, 379, 310, 109; 326/27, 26, 82, 83

[56] References Cited

U.S. PATENT DOCUMENTS

| 5,081,374 | 1/1992 | Davis ........................................ 326/27 |
| 5,121,011 | 6/1992 | Ohya et al. ................................ 326/83 |
| 5,126,588 | 6/1992 | Reichmeyer et al. ................... 327/112 |
| 5,214,320 | 5/1993 | Truong ....................................... 326/83 |
| 5,367,205 | 11/1994 | Powell ...................................... 326/27 |
| 5,438,278 | 8/1995 | Wong et al. .............................. 326/27 |

FOREIGN PATENT DOCUMENTS

| 0466238 | 6/1991 | European Pat. Off. ............... 327/111 |
| 0282981A2 | 3/1988 | Germany .......................... H02K 5/02 |
| 3708499C2 | 9/1989 | Germany .......................... H03K 5/01 |
| 4109146A1 | 9/1992 | Germany .......................... H03K 5/02 |

Primary Examiner—Timothy P. Callahan
Assistant Examiner—Terry L. Englund
Attorney, Agent, or Firm—Plevy & Assocaites

[57] ABSTRACT

A MOS driver circuit has a first output transistor and a second output transistor which are driven in push-pull into a conducting state by a first driver stage having first high impedance and first low impedance elements and a second driver stage having second high impedance and second low impedance elements, respectively. The high impedance driver elements drive the output transistors into a conducting or nonconducting state and the low impedance driver elements hold the output transistors in the nonconducting state. The junction of the output transistors can be connected to a load. A holding stage for each driver stage is cross coupled to a high impedance driver element of one output transistor and the low impedance driver element of the other output transistor, so as to drive one output transistor in the conducting state while holding the other output transistor in a nonconducting state. As a result, shunt currents between the output transistors are avoided even in the presence of output noise.

19 Claims, 1 Drawing Sheet

MOS DRIVER CIRCUIT FOR SUPPRESSING INTERFERENCE BY PREVENTING SHUNT CURRENTS

FIELD OF THE INVENTION

The present invention relates generally to a MOS driver circuit and more particularly, to a MOS driver circuit having improved interference suppression capabilities.

BACKGROUND OF THE INVENTION

A MOS driver circuit can comprise a first output transistor and a second output transistor which are driven in push-pull into a conducting or nonconducting state by a first driver stage and a second driver stage, respectively, and which are interconnected at a junction point to which a load to be driven is connectable, with a first hold stage connected between a data input and the first driver stage, and a second hold stage connected between the data input and the second driver stage, the first hold stage transferring a data signal coming from the data input to the first driver stage in response to an enable signal provided by the second driver stage, and the second hold stage transferring the data signal coming from the data input to the second driver stage in response to an enable signal provided by the first driver stage.

Such a driver circuit is disclosed in co-pending German Patent Application Number DE-C 3708499, assigned to SGS Halbleiter-Beuelemente GmbH filed in the names of the inventors Hans Reichmeyer and Josef Stockinger. It is typically used as an output stage of logic circuits in CMOS technology which serves to drive loads. In such driver circuits, steep pulse edges must be prevented, since they may cause interference because of their high frequency components. Therefore, the output transistors of the driver stages are driven into the conducting or nonconducting state such that the transition is continuous, i.e., not rectangular, but with a distinctly limited edge steepness. To accomplish this, high-impedance driver stages are used.

Such a driver circuit has the disadvantage that when noise-loaded outputs are driven, a shunt current may flow between the output transistors while the output transistors are being held in the conducting or nonconducting state. This is due to the fact that in the presence of external interference, the voltage at the drain of the output transistor which is in the nonconducting state will change. Since there is always a parasitic capacitance between the drain and the gate of the transistor, the gate voltage of the transistor will also change. This voltage change may cause the transistor to be switched into a conducting state, so that a shunt current will flow between the transistors. External interference can reach an output, e.g., through capacitive and inductive coupling of adjacent signals which are present, for example, in the integrated circuit package, on the circuit board, or in a cable harness. Such shunt currents cause unnecessary power dissipation and unnecessary electromagnetic interference.

It is the object of the invention to provide a MOS driver circuit in which any shunt currents between the output transistors are prevented when driving resistive, capacitive, and inductive loads.

SUMMARY OF THE INVENTION

The present invention is a MOS driver circuit having improved interference suppression capabilities in which shunt currents between the output transistors are prevented when driving resistive, capacitive, and inductive loads. The driver circuit has a first output transistor and a second output transistor which are driven in push-pull into a conducting or nonconducting state by a first driver stage and a second driver stage, respectively, and whose junction is the output which can be connected to a load. A first hold stage is connected between a data input and the first driver stage, and a second hold stage is connected between the data input and the second driver stage, the first hold stage transferring a data signal coming from the data input to the first driver stage in response to an enable signal from the second driver stage, and the second hold stage transferring the data signal to the second driver stage in response to an enable signal from the first driver stage. When driving resistive, capacitive, or inductive loads, shunt currents flowing between the output transistors despite the latter being driven with slowly rising, interference-reducing edges are prevented, even with capacitive or inductive interference acting on the output, by implementing each of the first and second driver stages with a low-impedance driver element and a high-impedance driver element, the high-impedance driver elements driving the output transistors into the conducting or nonconducting state, and the low-impedance driver elements holding the output transistors in the nonconducting state.

BRIEF DESCRIPTION OF THE DRAWING

For a full understanding of the present invention, the above objects and further features and advantages of the invention are described in detail in an exemplary embodiment below in conjunction with the drawing, for which.

DETAILED DESCRIPTION OF THE INVENTION

Figure 1:
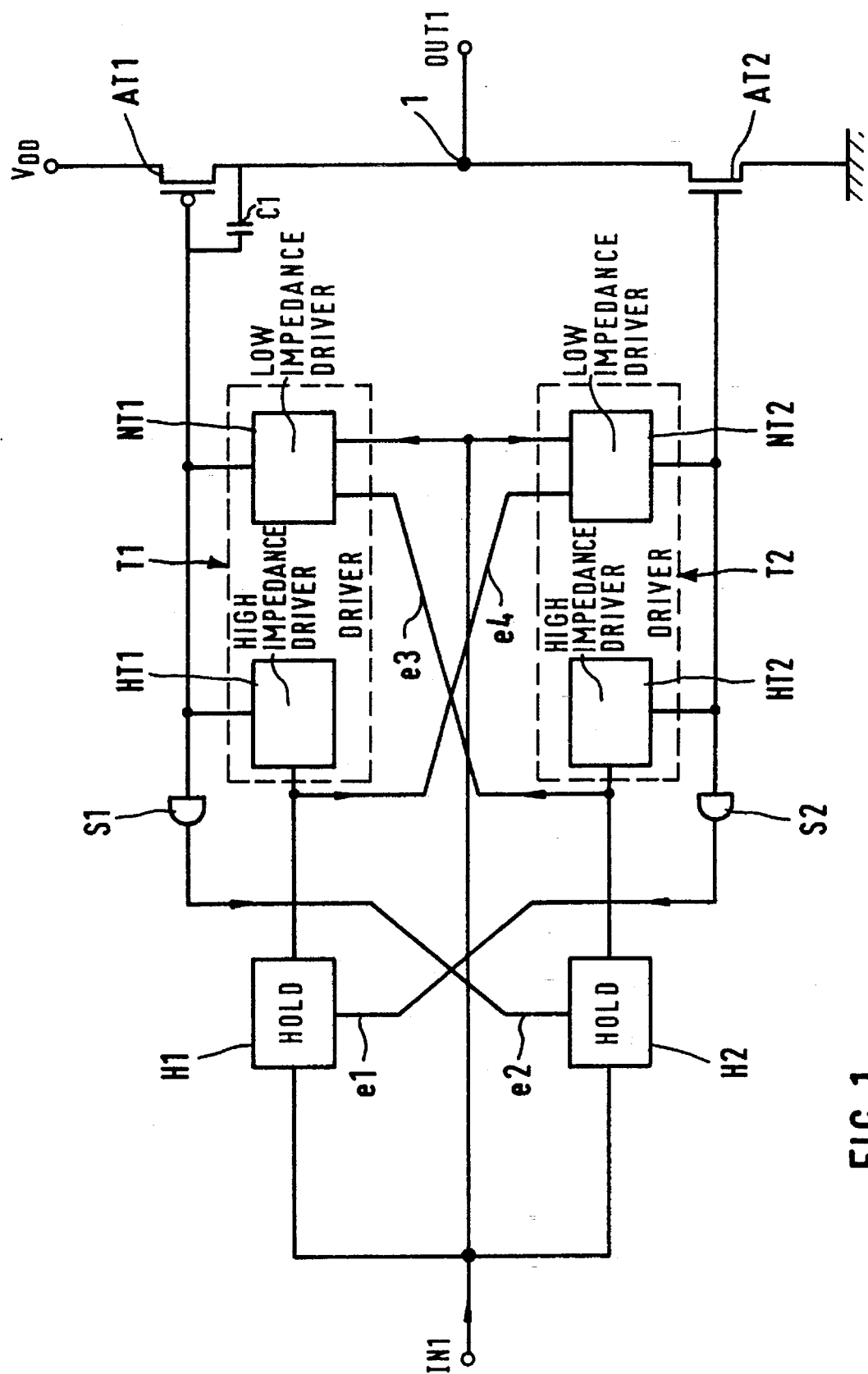
FIG. 1 is a schematic representation of one embodiment of the MOS driver circuit according to the invention.

A MOS driver circuit can comprise a first output transistor and a second output transistor which are driven in push-pull into a conducting or nonconducting state by a first driver stage and a second driver stage, respectively, and which are interconnected at a junction point to which a load to be driven is connectable, with a first hold stage connected between a data input and the first driver stage, and a second hold stage connected between the data input and the second driver stage, the first hold stage transferring a data signal coming from the data input to the first driver stage in response to an enable signal provided by the second driver stage, and the second hold stage transferring the data signal coming from the data input to the second driver stage in response to an enable signal provided by the first driver stage.

Such a driver circuit is disclosed in co-pending German Patent Application Number DE-C 3708499, assigned to SGS Halbleiter-Beuelemente GmbH filed in the names of the inventors Hans Reichmeyer and Josef Stockinger. It is typically used as an output stage of logic circuits in CMOS technology which serves to drive loads. In such driver circuits, steep pulse edges must be prevented, since they may cause interference because of their high frequency components. Therefore, the output transistors of the driver stages are driven into the conducting or nonconducting state such that the transition is continuous, i.e., not rectangular, but with a distinctly limited edge steepness. To accomplish this, high-impedance driver stages are used.

Such a driver circuit has the disadvantage that when noise-loaded outputs are driven, a shunt current may flow between the output transistors while the latter are being held in the conducting or nonconducting state. This is due to the fact that in the presence of external interference, the voltage at the drain of the output transistor which is in the nonconducting state will change. Since there is always a parasitic capacitance between the drain and the gate of the transistor, the gate voltage of the transistor will also change. This voltage change may cause the transistor to be switched into a conducting state, so that a shunt current will flow between the transistors. External interference can reach an output, e.g., through capacitive and inductive coupling of adjacent signals which are present, for example, in the integrated circuit package, on the circuit board, or in a cable harness.

Shunt currents between the output transistors are prevented when driving resistive, capacitive, and inductive loads by providing a MOS driver circuit of the kind referred to above, wherein the first and second driver stages each comprise a low-impedance driver element and a high-impedance driver element, the high-impedance driver elements driving the output transistors into the conducting or nonconducting stage, and the low-impedance driver elements holding the output transistors in the nonconducting state.

High-impedance MOS driver elements and low-impedance MOS driver elements are well known to those ordinarily skilled in the art. Examples of such high-impedance and low-impedance elements may be had by referring to a book entitled "Manual For MOS Users" by John D. Lenk, published by Reston Publishing Company, Inc. in 1975. Other examples of high-impedance elements and low-impedance elements are well known to those ordinarily skilled in the art. The embodiment of the present invention utilizes a common-source configuration.

The high-impedance driver elements and the low-impedance driver elements can be implemented for example, with two transistors driven out of phase. Of these, the transistor connected to the positive supply voltage will typically be a p-channel transistor, and the grounded transistor will be an n-channel transistor. The high impedance of the driver elements and the low impedance of the driver elements can be achieved by appropriate design of the transistors. For the high-impedance driver elements, transistors with a small w/l ratio can be used. For the low-impedance driver elements, transistors with a large w/l can be used. The w/l ratio of the low-impedance driver elements and the high-impedance driver elements may typically differ by a factor of 10 to 20, but considerably larger or smaller factors may be appropriate for the respective application.

Thus, according to the present invention, there are two separate circuits for changing the output state and for the steady-state operation of the driver circuit. Through the division of each of the driver stages into a high-impedance driver element and a low-impedance driver element in accordance with the present invention, the transition of the output transistors into the conducting or nonconducting state is continuous, i.e., takes place with a distinctly limited edge steepness, and nevertheless, after an output transistor has reached the nonconducting state, a shunt current between the two transistors is reliably prevented, even if the output is affected by noise. The low-impedance driver elements hold the gate of the respective output transistor at a fixed voltage. Consequently, the state of the transistor is not influenced by a pulse which appears at the output of the circuit. The effect of the pulse which appears at the output of the circuit is suppressed because its coupling through the parasitic Miller capacitance onto the gate is minimal due to the low impedance gate drive.

Advantageously, the first and second hold stages transfer the data signal to the first and second driver stages, respectively, in such a way that the first and second output transistors are not driven into the conducting state until the second and first output transistors, respectively, have reached the nonconducting state. In this manner, a shunt current is prevented from flowing through the transistors during the change of the output state. In a preferred embodiment of the present invention, two threshold elements are provided, respectively, between an output of the first driver stage and an enable-signal input of the second hold stage and between an output of the second driver stage and an enable-signal input of the first hold stage which, when a given voltage level is reached, apply the respective enable signals to the second and first hold stages, respectively, if the first/second output transistor is to be driven into the nonconducting state and the second/first output transistor is to be driven into the conducting state, respectively. This circuitry for preventing shunt currents in the output transistors is easy to implement and permits precise sequence control, which requires no analog delay elements.

Each of the hold circuits advantageously contains a flip-flop. With the flip-flops, the respective driver stage can be locked in the low-impedance condition after, in response to a change of state at the input, the high-impedance driver stages have caused the change of state at the output.

In another preferred embodiment of the present invention, the data signal is applied to one input of each of the low-impedance driver elements, and the output signals from the second and first hold stages are applied to enable inputs of the low-impedance driver elements of the first and second driver stages, respectively, so as to turn on the respective low-impedance driver element after the respective input transistor has been driven into the conducting state. This ensures in a reliable and simple manner that the low-impedance driver elements do not take over the hold functions of the output transistors in the conducting state until the change of the output state has been completed. Advantageously, a change of state of the data signal turns off the respective low-impedance driver element before the output transistors are driven into the conducting or nonconducting state, i.e., into the respective other state, by the high-impedance driver elements.

It may also be advantageous to connect a capacitor between the gate and the drain of one of the output transistors. This is advantageous in applications where a capacitor with a capacitance higher than the parasitic capacitance between gate and drain is needed, e.g., of the gate drive signals for the output transistors should rise and fall as slowly as possible. Normally, such a capacitor would greatly increase the risk of shunt currents through the transistors in the presence of output noise. In the arrangement according to the present invention, however, this is not problematic, since in this case, too, the low-impedance driver reliably prevents the occurrence of such shunt currents.

Referring to FIG. 1, the MOS driver circuit shown includes a first output transistor AT1 and a second output transistor AT2, with a data signal applied at a data input IN1, the transistors AT1, AT2 are driven in push-pull into a conducting or nonconducting state via hold circuits H1, H2 and driver stages T1, T2. In the embodiment shown, the first output transistor AT1, which is connected between the positive voltage supply $V_{DD}$ and the junction point 1, is a p-channel transistor, and the second output transistor AT2, which is connected between the junction point 1 and ground, is an n-channel transistor. The junction point 1 is coupled to the output OUT1, to which a load to be driven can be connected. The data signal coming from the data input IN1 is applied to both the first hold stage H1 and the second hold state H2. The data signal proceeds from the first hold stage H1 through the first driver stage T1 to the first output transistor AT1, and from the second hold stage H2 through the second driver stage T2 to the second output transistor AT2. The first driver stage T1 comprises a first low-impedance driver element NT1 and a first high-impedance driver element HT1, and the second driver stage T2 comprises a second low-impedance driver element NT2 and a second high-impedance driver element HT2. With the high-impedance driver elements HT1, HT2, the respective output transistors AT1, AT2 are driven into the conducting or nonconducting state, the switching into the conducting or nonconducting state taking place slowly, i.e., avoiding steep pulse edges. When the output transistor AT1 or AT2 has reached the nonconducting state, it must be held in this state. This is done with the low-impedance driver elements NT1, NT2. As a result, shunt currents between the output transistors AT1, AT2 are avoided even in the presence of output noise. Such shunt currents could be caused by noise signals at the output OUT1 if the nonconducting state were held by the high-impedance driver element HT1 or HT2, because this would result in a voltage change at the drain of the respective nonconducting transistor AT1 or AT2. Since there always exists a parasitic capacitance between the drain and the gate of this transistor, the voltage at this gate would change as well. This may render the transistor conductive, so that a shunt current would flow between the two transistors. Such shunt currents are prevented by holding the output transistors AT1, AT2 with the low-impedance driver elements NT1, NT2, which determine the gate voltages of the transistors AT1 and AT2, respectively.

The switching of the output transistors AT1, AT2 with the high-impedance driver elements HT1, HT2 takes place in such a way that during the change of the output state, simultaneous conduction of the two output transistors AT1, AT2 is reliably avoided. To this end, a threshold element S1 is provided between the output of the first high-impedance driver element HT1 and an input for the enable signal e2 of the second hold stage H2. Connected between the output of the second high-impedance driver element HT2 and an input for the enable signal e1 of the first hold stage H1 is a threshold element S2. The threshold element S1 does not pass the enable signal e2 to the second hold stage H2 until a given voltage level is reached. Thus, the hold stage H2 will receive the enable signal e2, in response to which the data signal is transferred from the second hold stage H2 to the second high-impedance driver element HT2, only when the first output transistor AT1 is already in the nonconducting state. Only then will the second high-impedance driver element HT2 begin to drive the second output transistor AT2 into the conducting state. Similarly, the second threshold element S2 does not apply the enable signal e1 to the first hold stage H1 until a given voltage level is reached. Thus, the hold stage H1 will transfer the signal for driving the first output transistor AT1 into the conducting state to the first high-impedance driver element HT1 only when the second output transistor AT2 has reached the nonconducting state.

Each of the hold stages H1, H2 can be implemented with a flip-flop. These bi-stable elements are driven so that after a change of the input state, first the output is caused to change by driving the output transistors with the high-impedance driver elements, but then the non-conducting output transistor's driver element is locked in the low-impedance condition. Any return to the high-impedance condition, e.g., due to external interference, is thus impossible. The output transistor AT1 is switched into the nonconducting state by direct transfer of the data signal from the hold stage H1 to the high-impedance driver element HT1, and the output transistor AT2 is switched into the nonconducting state by direct transfer of the data signal from the hold stage H2 to the high-impedance driver element HT2.

The first low-impedance driver element NT1 is driven by a combination of the data signal and the enable signal e3 coming from the output of the hold stage H2. Similarly, the second low-impedance driver element NT2 is driven by a combination of the data signal and the enable signal e4 coming from the output of the first hold stage H1. In the embodiment shown, when the state of the data signal changes, the low-impedance driver elements NT1, NT2 are turned off before the output transistors AT1, AT2 are driven into the other state. To this end, the data signal is applied directly to the low-impedance driver elements NT1, NT2. The switching operations are implemented by a suitable arrangement of logic elements, as is well known to those ordinarily skilled in the art.

All of the functions described are performed by suitably interconnected logic elements. AND gates, OR gates, and inverters are used, depending on the function to the performed.

In the embodiment shown, an integrated capacitor C1 is provided between the gate and drain of the first output transistor AT1. The integrated capacitor C1 is present in addition to the parasitic capacitance. The value of the integrated capacitor C1 is chosen so that the total Miller capacitance of the p-channel output transistor is brought to a value which is better suited for providing a slow gate driver for the p-channel transistor than the parasitic gate-drain capacitance alone.

It will be understood that the embodiment described herein is merely exemplary and that a person skilled in the art may make many variations and modifications without departing from the spirit and scope of the present invention. All such modifications are intended to be included within the scope of the present invention as defined in the appended claims.

What is claimed is:

1. A MOS driver circuit comprising:

a first output transistor of a first conductivity type, having a first electrode, a second electrode and a control electrode, said first electrode coupled to a first supply potential;

a second output transistor of a second conductivity type, having a first electrode, a second electrode and a control electrode, said second electrode coupled to a second supply potential;

an output line coupled to said second electrode of said first output transistor and said first electrode of said second output transistor;

input means for receiving an input data signal;

first driving means, for driving said first output transistor into one of a conducting state and a nonconducting state, providing a first enable signal, said first driving means being coupled to said input data signal, said first driving means including a first low-impedance driver element and a first high-impedance driver element, said first high-impedance driver element operable to drive said first output transistor into one of said conducting state and said nonconducting state, and said first low-impedance driver element operable to hold said first output transistor in said nonconducting state to permit said second output transistor to be driven into said conducting state;

second driving means, for driving said second output transistor into one of a conducting state and a nonconducting state, providing a second enable signal, said second driving means being coupled to said input data signal, said second driving means including a second low-impedance driver element and a second high-impedance driver element, said second high-impedance driver element operable to drive said second output transistor into one of said conducting state and said nonconducting, state, and said second low-impedance driver element operable to hold said second output transistor in said nonconducting state to permit said first transistor to be driven into said conducting state;

first hold means for sending said input data signal to said first driving means in response to said second enable signal;

second hold means for sending said input data signal to said second driving means in response to said first enable signal;

wherein said first output transistor and said second output transistor are complementarily driven into said conducting state and said nonconducting state.

2. The MOS driver circuit as recited in claim 1, wherein said first output transistor is not driven into said conducting state until said second output transistor is in said nonconducting state and said second output transistor is not driven into said conducting state until said first output transistor is in said nonconducting state.

3. The MOS driver circuit as recited in claim 1, further comprising a first threshold element coupled between said first driving means and said second hold means to receive said first enable signal, said first threshold element releasing said first enable signal to said second hold means when said first enable signal exceeds a predetermined threshold.

4. The MOS driver circuit as recited in claim 3, further comprising a second threshold element coupled between said second driving means and said first hold means to receive said second enable signal, said second threshold element releasing said second enable signal to said first hold means when said second enable signal exceeds a predetermined threshold.

5. The MOS driver circuit as recited in claim 1, wherein said input data signal, received by said input means, in combination with said sent input data signal from said first hold means enables said second low-impedance driver element to hold said second output transistor in said nonconducting state after said second output transistor is in said nonconducting state.

6. The MOS driver circuit as recited in claim 1, wherein said input data signal, received by said input means, in combination with said sent input data signal from said second hold means enables said first low-impedance driver element to hold said first output transistor in said nonconducting state after said first output transistor is in said nonconducting state.

7. The MOS driver circuit as recited in claim 1, further comprising a capacitor coupled between the control electrode and the second electrode of said first output transistor.

8. The MOS driver circuit as recited in claim 1, further comprising a capacitor coupled between the control electrode and the first electrode of said second output transistor.

9. The MOS driver circuit as recited in claim 1, wherein said low-impedance driver element of said first driving means is enabled in response to said input data signal and said second hold means after said first output transistor and said second output transistor are driven into said conducting or said nonconducting state.

10. The MOS driver circuit as recited in claim 1, wherein said low-impedance driver element of said second driving means is enabled in response to said input data signal and said first hold means after said first output transistor and said second output transistor are driven into said conducting or said nonconducting state.

11. The MOS driver circuit as recited in claim 1, wherein said first output transistor is a p-channel transistor and said second output transistor is an n-channel transistor.

12. The MOS driver circuit as recited in claim 1, wherein said first conductivity type is a p-channel device and said second conductivity type is an n-channel device.

13. A MOS driver circuit comprising:

a first output transistor and a second output transistor which are driven in a push-pull manner into one of a conducting and nonconducting state by a first driver stage and a second driver stage, respectively, one of said conducting and nonconducting state not occurring simultaneously in both first and second output transistors, and which are interconnected at a junction point to which a load to be driven is connectable, with a first hold stage connected between a data input and the first driver stage, and a second hold stage connected between the data input and the second driver stage, the first hold stage transferring a data signal coming from the data input to the first driver stage in response to an enable signal provided by the second driver stage, and the second hold stage transferring the data signal coming from the data input to the second driver stage in response to an enable signal provided by the first driver stage, wherein the first and second driver stages each comprise a low-impedance driver element and a high-impedance driver element, each high-impedance driver element operable to drive the respective output transistor into one of the conducting and nonconducting state, and each low-impedance driver element operable to hold the respective output transistor in the nonconducting state to permit the other one of the output transistors to be driven into said conducting state.

14. The MOS driver circuit as recited in claim 13, wherein the first hold stage and second hold stage transfer the data signal to the first and second driver stages, respectively, so that the first and second output transistors are not driven into the conducting state until the second and first output transistors, respectively, have reached the nonconducting state.

15. The MOS driver circuit as recited in claim 13, further comprising two threshold elements, one between an output of the first driver stage and an enable-signal input of the second hold stage and the other between an output of the second driver stage and an enable-signal input of the first hold stage, which, when a given voltage level is reached, apply the respective enable signals to one of the second and first hold stages, respectively, as soon as the respective first or second output transistor, has been driven into the nonconducting state.

16. The MOS driver circuit as recited in claim 13, wherein each of the hold stages contains a flip-flop which locks the low impedance driver element of one of said first and second driver stages after the output transistor coupled to one of said second and first driver stages, respectively, has reached the nonconducting state.

17. The MOS driver circuit as recited in claim 13, wherein the data signal is applied to one input of each of the low-impedance driver elements, and the second and first hold stages each provide their transferred data signal to the low-impedance driver elements of the first and second driver stages, respectively, so as to turn on the respective low-impedance driver element after the output transistors have been driven into the nonconducting state.

18. The MOS driver circuit as recited in claim 13, wherein said first output transistor includes a gate and drain electrode and the MOS driver circuit further comprising a capacitor connected between said gate electrode and said drain electrode of the first output transistor.

19. The MOS driver circuit as recited in claim 13, wherein said second output transistor includes a gate and drain electrode and the MOS driver circuit further comprising a capacitor connected between said gate electrode and said drain electrode of the second output transistor.

* * * * *